United States Patent [19]
Thurn

[11] Patent Number: 6,122,970
[45] Date of Patent: Sep. 26, 2000

[54] ULTRASONIC TRANSDUCER

[75] Inventor: Rudolf Thurn, Pressath, Germany

[73] Assignee: Siemens AG, Munich, Germany

[21] Appl. No.: 09/202,173

[22] PCT Filed: Jun. 4, 1997

[86] PCT No.: PCT/DE97/01125

§ 371 Date: Mar. 1, 1999

§ 102(e) Date: Mar. 1, 1999

[87] PCT Pub. No.: WO97/47403

PCT Pub. Date: Dec. 18, 1997

[30] Foreign Application Priority Data

Jun. 10, 1996 [DE] Germany ............... 196 23 071

[51] Int. Cl.$^7$ ............................................... H01L 41/00
[52] U.S. Cl. ............................................ 73/662; 310/369
[58] Field of Search .................. 73/662, 649, DIG. 1, 73/DIG. 4, 570; 310/311, 320, 321, 322, 326, 367, 369

[56] References Cited

U.S. PATENT DOCUMENTS 5,659,220  8/1997  Thurn ....................................... 310/369

FOREIGN PATENT DOCUMENTS

| 390 959 | 10/1990 | European Pat. Off. . |
| 25 41 492 | 3/1977 | Germany . |
| 38 42 759 | 6/1990 | Germany . |
| 42 33 256 | 12/1993 | Germany . |

OTHER PUBLICATIONS

"Plastic Disk Makes Transducer Excel in Calculating Distances by Ultrasound," Electronics International, vol. 51, No. 11, May 25, 1978, pp. 76–78.

Vasil'ev et al., "Sectional Radial–mode Piezoelectric Transducer," Soviet Physics Acoustics, vol. 26, No. 4, Jul.–Aug., 1980, pp. 284–286.

Kleinschmidt et al., "Ultrasonic Remote Sensors for Non-contact Object Detection," Siemens Forsc. u. Entwickl.–Ber., vol. 10, No. 2, 1981, pp. 110–118.

H. Franke, "Lexicon of Physics," 3rd Edition, Franckh'sche Verlagshandlung [Franckh Publishing House], Stuttgart, W. Keller & Co., 1969, p. 94. Translation Provided.

Primary Examiner—Richard A. Moller
Attorney, Agent, or Firm—Kenyon & Kenyon

[57] ABSTRACT

An ultrasonic transducer with a piezoceramic disk in radial resonance operation is created to produce a narrow main cone angle with suppresion of secondary cones. This is accomplished with the help of a ring surrounding the piezoceramic disk on its lateral face with a form fit and frictional engagement, this ring being made of a material whose longitudinal wave velocity is higher than that of aluminum.

7 Claims, 2 Drawing Sheets

ULTRASONIC TRANSDUCER

FIELD OF THE INVENTION

The present invention relates to an ultrasonic transducer a piezoceramic disk in radial resonance operation and with a ring surrounding the piezoceramic disk on its lateral surface with a form fit and frictional engagement.

BACKGROUND INFORMATION

Conventional ultrasonic transducers are described in numerous publications. Many applications, such as ultrasonic sensors and proximity switches, require ultrasonic transducers having a very narrow sound cone characteristic while at the same time having very small secondary cone amplitudes.

German Patent No. 25 41 492 describes a very sharp ultrasonic transducer with saturn geometry, which is widely used with ultrasonic sensors in industrial applications. It is constructed from a piezoceramic disk, an adapting layer disk and a concentric metal ring. The area of the adapting layer is large because the adapting layer disk projects a great distance beyond the diameter of the piezoceramic disk, thus yielding a very narrow angle $\phi$ of the sound cone of 5°. Due to the large projecting area of the adapting layer disk, it is difficult to always accurately maintain the favorable vibrational amplitude distribution and phase angle over the entire area in practice, thus resulting in problematic lateral secondary cones.

German Patent No. 42 33 256 describes an ultrasonic transducer with a round piezoceramic disk in radial resonance, having a reduced operating frequency in comparison with the radial resonant frequency of the piezoceramic disk for given dimensions of the piezoceramic disk. This is achieved using a metal ring surrounding the piezoceramic disk with a form fit and frictional engagement, preferably being shrunk-fit onto the piezoceramic disk. The composite body formed by the piezoceramic disk and the metal ring forms a radial oscillator which behaves like a piezoelectric body with a larger diameter and a reduced frequency with regard to its vibrational properties. By appropriate dimensioning of the metal ring, the operating frequency can be reduced to different extents. An adapting layer is applied to the end face of the composite body.

SUMMARY OF THE INVENTION

An object of the present invention is to create an ultrasonic transducer of the with improved transmission properties with regard to the main cone angle and suppression of secondary cones and to obtain the narrowest possible main cone angle in particular.

This object is achieved according to the present invention by the fact that the ring is made of a material in which the velocity of sound is higher than that in aluminum. Thus, the resulting radial resonant frequency of the composite body of piezoceramic disk and ring is either reduced less than is the case with aluminum, or it may remain the same or be significantly higher than the original radial resonant frequency of the piezoceramic disk in a defined manner, despite the larger diameter. As a consequence, the ratio of the diameter of the sound transmitting surface to the wavelength of the ultrasonic wave transmitted, which is inversely proportional to the radial resonant frequency, is increased for the composite body whose end face is usually approximately the same size as the sound transmitting surface. Therefore, with the ultrasonic transducer according to the present invention −3 dB, sound cone angles of less than 5° can be achieved with secondary cone damping of approx. −30 dB in comparison with the main cone amplitude. The main influencing parameter here is the longitudinal wave velocity of the ring material, while the radial resonant frequency can be adjusted only within comparatively narrow limits through variation of the geometric dimensions of the ring in a reasonable and practical range.

DETAILED DESCRIPTION

Figure 1:
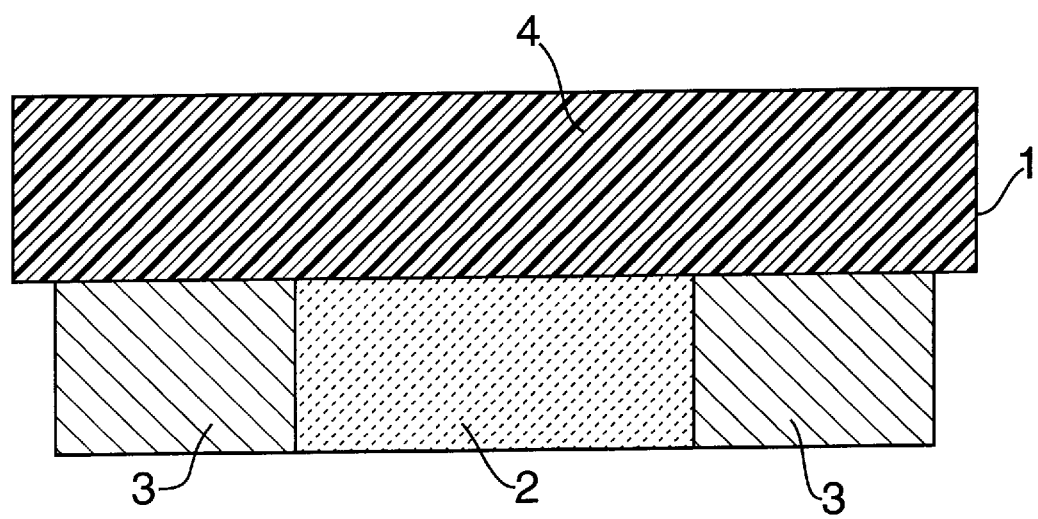
FIG. 1 shows a sectional view of an ultrasonic transducer according to the present invention.

FIG. 1 shows a sectional view of ultrasonic transducer 1 according to the present invention. It essentially has a cylindrical piezoceramic disk 2, a ring 3 and an adapting layer 4. Ring 3 surrounds piezoceramic disk 2 on its lateral surface with a form fit and frictional engagement, with the bond preferably being established by gluing. One surface of this composite body is provided with adapting layer 4 whose diameter corresponds approximately to the outside diameter of the ring and whose thickness corresponds approximately to a quarter wavelength of the ultrasonic wave generated. Syntactic foam materials of synthetic resin with glass beads or rubbery substances such as silicones are preferably used for coupling the characteristic wave resistance to air. Due to the adapting layer, the ultrasonic wave is transmitted essentially only on the free end face of adapting layer 4. The present invention uses a material for ring 3 whose longitudinal wave velocity is higher than that of aluminum. This yields a higher effective longitudinal wave velocity of the composite body in comparison with piezoceramic disk 2, resulting in an increased resonant frequency of the radial oscillation mode of the composite body, which has a positive effect on the transmission properties of ultrasonic transducer 1. This yields a larger ratio of transmitting surface to wavelength of the ultrasonic wave, and thus the sound cone angle becomes narrower in the desired manner. In addition to the longitudinal wave velocity of ring 3, this effect is stronger, the larger the volume of ring 3 relative to the total volume of the composite of piezoceramic disk 2 and ring 3. This means that a larger ratio of transmitting surface to wavelength is obtained with a larger ratio of the outside diameter of the ring to the diameter of piezoceramic disk 2. Tests have revealed especially good transducer properties for diameter ratios in the range of approximately 1.05 to 3.

Materials such as silicon, silicon dioxide, silicon nitride, silicon carbide or aluminum oxide may be used as the material with a high longitudinal wave velocity for ring 3. An especially suitable metallic material is beryllium, whose longitudinal wave velocity is approx. 12,600 m/s. Certain metals such as titanium, special steel alloys, nickel alloys such as Inconel, etc. have equally high longitudinal wave velocities. Another material property of ring 3 is its mechanical vibrational quality. A high vibrational quality is essential for transducers with a high acoustic sensitivity. However, materials of a low vibrational quality are used for broad-band transducers. One example embodiment of the present invention may include the following materials, for example, piezoceramic disk 2 may be made of lead zirconate titanate and ring 3 may be made of aluminum oxide ceramic, achieving a sound cone angle of approx. 5° (solid angle with a −3 dB drop in sound pressure level) when the ratio of outside diameter of ring 3 to the diameter of piezoceramic disk 2 is about 2. Secondary cone suppression is better here than −30 dB.

An advantageous embodiment of the present invention is obtained if the lateral face of the adapting layer disk is provided with an adapted contour having at least one indentation and/or bulge with a round, triangular, rectangular or trapezoidal cross section, for example. The adapted contour may easily also be characterized in that the lateral surface of the adapting layer disk has a straight or curved inclined shape in cross section, so that the inside and outside base faces of the adapting layer are of different surface areas. An adapted contour may also be provided on the inside base face of the adapting layer, which is in the form of concentric grooves here, for example. With these additional measures, desired transducer properties such as certain sound cone forms adapted to specific applications can be achieved in a controlled manner.

Figure 2:
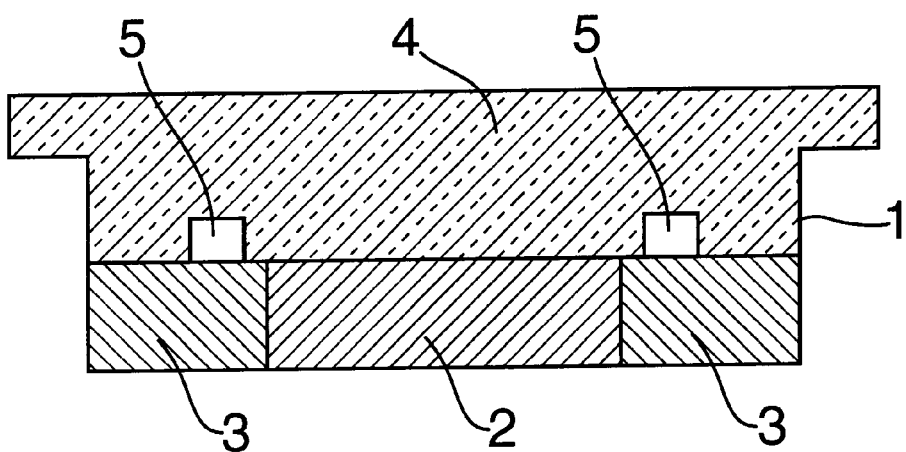
FIG. 2 shows a sectional view of an example embodiment of the present invention.

FIG. 2 shows an example embodiment of the present invention having a concentric groove 5.

Although the present invention is explained with reference to the embodiment illustrated in the accompanying drawing, it should be recalled that this is not intended to restrict the present invention to the embodiment presented here, but instead all possible variations, modifications and equivalent arrangements are to be included, inasmuch as they are also covered by the content of the patent claims.

What is claimed is:

1. An ultrasonic transducer, comprising:

a piezoceramic disk in a radial resonance operation;

an adapting layer having a disk shape; and a ring surrounding the piezoceramic disk and frictionally connected and form-locked to a lateral circumferential surface of the piezoceramic disk, the ring being composed of a predetermined material, a longitudinal wave velocity of the predetermined material being higher than a longitudinal wave velocity of aluminum.

2. The ultrasonic transducer according to claim 1, wherein the ring is composed of a ceramic material.

3. The ultrasonic transducer according to claim 1, wherein a velocity of sound in the material of the ring is higher than a longitudinal wave velocity of aluminum oxide.

4. The ultrasonic transducer according to claim 1, wherein the ring is composed of a metal material.

5. The ultrasonic transducer according to claim 1, wherein the ring is bonded to the piezoceramic disk via glue.

6. The ultrasonic transducer according to claim 1, wherein a ratio of an outside diameter of the ring to an inside diameter of the ring is in a range between 1.05 and 3.

7. The ultrasonic transducer according to claim 1, wherein an inside base face of the adapting layer has an adapted contour, the inside base face being a surface of the adapting layer facing the piezoceramic disk and the ring.

\* \* \* \* \*